(12) United States Patent
Liu et al.

(10) Patent No.: US 10,592,631 B2
(45) Date of Patent: Mar. 17, 2020

(54) METHOD FOR PERFORMING NETLIST COMPARISON BASED ON PIN CONNECTION RELATIONSHIP OF COMPONENTS

(71) Applicants: Guangzhou Fastprint Circuit Tech Co., Ltd., Guangzhou (CN); Shenzhen Fastprint Circuit Tech Co., Ltd., Shenzhen (CN)

(72) Inventors: Zhirui Liu, Guangzhou (CN); Zhongyu Mao, Guangzhou (CN)

(73) Assignees: Guangzhou Fastprint Circuit Tech Co., Ltd., Guangzhou (CN); Shenzhen Fastprint Circuit Tech Co., Ltd., Shenzhen (CN)

(*) Notice: Subject to any disclaimer, the term of this patent is extended or adjusted under 35 U.S.C. 154(b) by 0 days.

(21) Appl. No.: 15/778,156

(22) PCT Filed: Aug. 26, 2016

(86) PCT No.: PCT/CN2016/096912
§ 371 (c)(1),
(2) Date: May 22, 2018

(87) PCT Pub. No.: WO2017/088540
PCT Pub. Date: Jun. 1, 2017

(65) Prior Publication Data
US 2018/0341741 A1    Nov. 29, 2018

(30) Foreign Application Priority Data

Nov. 24, 2015   (CN) .......................... 2015 1 0827279

(51) Int. Cl.
*G06F 17/50* (2006.01)

(52) U.S. Cl.
CPC ...... *G06F 17/5081* (2013.01); *G06F 17/5045* (2013.01)

(58) Field of Classification Search
USPC ......................................... 716/110
See application file for complete search history.

(56) References Cited

U.S. PATENT DOCUMENTS 8,943,459 B2    1/2015  Lin et al.
2002/0004931 A1*  1/2002  Stralen ................ G06F 17/5022
                                                         716/102

(Continued)

FOREIGN PATENT DOCUMENTS

CN    1582088 A    2/2005
CN    102054077 A    5/2011

(Continued)

OTHER PUBLICATIONS

International Search Report for Application No. PCT/CN2016/096912 dated Nov. 30, 2016, 2 pages.

(Continued)

*Primary Examiner* — Bryce M Aisaka
(74) *Attorney, Agent, or Firm* — Seyfarth Shaw LLP

(57) ABSTRACT

Disclosed is a method for performing netlist comparison based on a pin connection relationship of a component, comprising the steps: acquiring a schematic diagram netlist file generated by a schematic diagram, and acquiring a PCB netlist file generated by a PCB; reading a network in the schematic diagram netlist file, forming a netlist connection relationship corresponding to each network into a schematic diagram array, all schematic diagram arrays forming a schematic diagram array set; reading a network in the PCB netlist file, forming a netlist connection relationship corresponding to each network into a PCB array, all PCB arrays forming a PCB array set; and comparing the schematic diagram array set with the PCB array set, and outputting (Continued)

differences between the two array sets. The present disclosure merely compares the connection relationship of components. With regard to the condition where a pin connection relationship of an element does not change but a network name changes, occurring during the conversion of different pieces of EDA software, and the present disclosure can effectively guarantee the accuracy of a connection after a schematic diagram and a PCB network are converted. The present disclosure can be widely applied to netlist comparison systems of pin connection relationships of various EDA software components.

5 Claims, 3 Drawing Sheets

(56) References Cited

U.S. PATENT DOCUMENTS

2014/0317587 A1   10/2014   Lin et al.
2015/0294060 A1   10/2015   Jian
2018/0034174 A1   11/2018   Liu et al.

FOREIGN PATENT DOCUMENTS

| CN | 102354325 A | 2/2012 |
| CN | 103793565 A | 5/2014 |
| CN | 104091161 A | 10/2014 |
| CN | 104112031 A | 10/2014 |
| CN | 105335570 A | 12/2016 |
| JP | H0869486 A | 3/1996 |

OTHER PUBLICATIONS

Written Opinion for Application No. PCT/CN2016/096912 dated Nov. 30, 2016, 5 pages.
First Office Action for Chinese Patent Application No. 201510827279.5 dated Feb. 2, 2018, 5 pages.
Search Report for Chinese Patent Application No. 201510827279.5 dated Feb. 2, 2018, 1 page.

* cited by examiner

METHOD FOR PERFORMING NETLIST COMPARISON BASED ON PIN CONNECTION RELATIONSHIP OF COMPONENTS

CROSS REFERENCE TO RELATED APPLICATIONS

This is a National Stage application of PCT/CN2016/096912, filed Aug. 26, 2016, which claims priority to Chinese Patent Application No. 201510827279.5, filed Nov. 24, 2015, the disclosures of which are incorporated herein by reference in their entirety.

TECHNICAL FIELD

The present disclosure relates to the field of printed circuit board design in electronic design automation, and more particularly, to a method for performing electronic designed netlist comparison.

BACKGROUND TECHNOLOGY

PCB (Printed Circuit Board) is also known as PWB Printed Wire Board.

A netlist indicates the connection relationship between the devices in the PCB or the schematic diagram.

The EDA technology enables a designer, by using a computer as a tool, to design a PCB on the EDA software platform based on the circuit schematic diagram, so as to achieve the functions as desired. The design of the printed circuit board mainly refers to the layout design, and it is necessary to consider the layout of external connections, the optimized layout of the internal electronic components, and the optimized layout of metal wiring and via holes and many other factors.

In an EDA software for the circuit design, both the schematic diagram and the PCB diagram have netlists. For example, in an EDA schematic diagram design software, pins of several devices are connected, and it is represented in the netlist as:

B3-IN2 L45-1 X6-3 C753-1

B3-IN2 is the network name after the pins are connected together. L45-1, X6-3 and C753-1 represent, respectively, pin 1 of the L45 component, pin 3 of the X6 component, and pin 1 of the C753 component. Typically, in a netlist, the network name of each connection relationship in the netlist portion of both the schematic diagram and the PCB should be the same. However, due to improper operation or conversion of different EDA software products, it may result in a situation that the network name may be changed while the connection relationship of the pins of the components remains unchanged. As shown below, the PCB netlist in an EDA LAYOUT wiring design software corresponds to the connection of certain pins of the devices in the above schematic diagram, and it is represented in the netlist as follows:

\TESTA\ \L45\-\1\ \X6\-\3\ \C753\-\1\

\TeSTA\ is the network name after the pins are connected together. \L45\-\1\, \X6\-\3\ and \C753\-\1\ represent, respectively, pin 1 of the L45 component, pin 3 of the X6 component, and pin 1 of the C753 component. Since the software systems have different requirements in the format of the data format, there are some small differences in the format of the network name and the names of the pins in the PCB layout software, that is, the data is wrapped in "\". However, after removing the "\", the connection relationships are the same with the connection relationships of the component pins in the schematic diagram netlist, and only the first item, i.e., the network name, has changed (B3-IN2 is changed to TESTA).

Since the network connection relationship may be the same while the network name may have changed, it is difficult to compare whether the connection relationships contained in the PCB and the schematic diagram are consistent with each other after the schematic diagram design is completed. At this point, if the netlist of the schematic diagram is relocated back to the PCB, there may be a risk that the pins of some components are disconnected or new connections are added without prompt by the PBC software.

SUMMARY OF THE DISCLOSURE

In order to overcome the above technical problem, it is an object of the present disclosure to provide a method for performing netlist comparison, which can effectively ensure the correct comparison and correspondence of the netlists of the schematic diagram and the PCB.

The specific technical solution is as below:

A method for performing netlist comparison based on a pin connection relationship of components, including the steps: S1, acquiring a schematic diagram netlist file generated based on a schematic diagram, and acquiring a PCB netlist file generated based on a PCB; S2, reading a network in the schematic diagram netlist file, forming a netlist connection relationship corresponding to each network into a schematic diagram array, all schematic diagram arrays forming a schematic diagram array set; reading a network in the PCB netlist file, forming a netlist connection relationship corresponding to each network into a PCB array, all PCB arrays forming a PCB array set; and S3, comparing the schematic diagram array set with the PCB array set, and outputting differences between the two array sets.

Preferably, the step S3 specifically includes sub-steps: S31, comparing the schematic diagram arrays with the PCB arrays one by one individually, clearing exactly same arrays in the schematic diagram arrays and the PCB arrays, and forming a schematic diagram array subset and a PCB array subset respectively from the remaining arrays that are not exactly the same in the schematic diagram arrays and the PCB arrays; S32, comparing arrays in the schematic diagram array subset and the PCB array subset one by one; and S33, finding out the exactly same arrays, partially same arrays, and completely different arrays in the schematic diagram array subset and the PCB array subset.

Preferably, the step S33 specifically includes sub-steps: S331, comparing the schematic diagram arrays in the schematic diagram array subset with the PCB arrays in the PCB array subset and determining whether there is an intersection of the pins of the components; if there is an intersection, writing the non-intersecting component pins into a result file, and clearing two arrays with intersections; otherwise the method proceeds to step S332; S332, writing the arrays with no intersection between the schematic diagram array subset and the PCB array subset into the result file.

Preferably, the step S331 specifically includes sub-steps: S3311, reading the schematic diagram arrays in the schematic diagram array subset one by one; S3312, determining whether all the schematic diagram arrays in the schematic array subset have been read; if yes, then the method will end; otherwise, the method proceeds to S3313; S3313, comparing an i-th schematic diagram array in the schematic diagram array subset with a k-th PCB array in the PCB array subset, and determining whether there is an intersection of the pins of the components; if there is an intersection, writing the non-intersecting component pins into the result file and clearing two arrays with intersections, and then the method proceeds to step S3314; otherwise the method proceeds to S3315; S3314, letting i=i+1, and returning to step S3312; S3315, determining whether all the PCB arrays have been read; if yes, then writing the component pins with no intersection into the result file, letting i=i+1, and returning to step S3312.

Preferably, the step S31 specifically includes sub-steps: S311, reading the schematic diagram arrays one by one; S312, determining whether all the schematic diagram arrays have been read; if yes, then the method will end; otherwise the method proceeds to S313; S313, comparing an i-th schematic diagram array with a k-th PCB array and determine whether they are the same; if yes, then clearing the i-th schematic diagram array and the k-th PCB array; otherwise the method proceeds to S314; S314, determining whether all the PCB arrays have been read; if yes, then letting i=i+1 and returning to execute step S312; otherwise returning to execute step S313.

Preferably, the step S2 specifically includes sub-steps: S21, reading the schematic diagram netlist/PCB netlist files and processing the files line by line; S22, determining whether a character is a start character; if yes, the method proceeds to step S23; otherwise, the method goes back to step S21; S23, determining whether all network data have been read; if yes, then the method will end; otherwise the method proceeds to step S24; S24, forming a netlist connection relationship corresponding to each network into a schematic diagram array/PCB array, and then the method proceeds to step S23.

The beneficial effects of the present disclosure are as follows:

The present disclosure compares only the connection relationship of the components, and overcomes the problem of the existing EDA software. That is, the existing EDA software only compares the connection relationships having the same network names, but cannot compare the same connection relationships having different network names. Regarding the condition where a pin connection relationship of components does not change while a network name changes caused by the conversion of different EDA software products, the present disclosure can effectively ensure the accuracy of connection after a schematic diagram and a PCB network are converted.

The present disclosure can be widely applied to netlist comparison systems of pin connection relationships of various EDA software components.

BRIEF DESCRIPTION OF THE DRAWINGS

Embodiments of the present disclosure will be described in detail below with reference to the accompanying drawings.

DETAILED DESCRIPTION OF THE PREFERRED EMBODIMENTS

It should be noted that the embodiments and in the present application and the features in the embodiments can be combined with each other in case of no conflict.

Specific embodiments of the present disclosure are described in detail below taking an EDA file as an example.

In the EDA file, the start character of the connection relationship of the schematic diagram netlist file is "% NET" and the end character is "$" (or to the end without "$" in the last line). The start character of the connection relationship of the PCB netlist file is "% NET" and the end character is "% Part".

A method for performing netlist comparison based on a pin connection relationship of a component, including the steps: S1, acquiring a schematic diagram netlist file generated based on a schematic diagram, and acquiring a PCB netlist file generated based on a PCB; S2, reading a network in the schematic diagram netlist file, forming a netlist connection relationship corresponding to each network into a schematic diagram array, all schematic diagram arrays forming a schematic diagram array set; reading a network in the PCB netlist file, forming a netlist connection relationship corresponding to each network into a PCB array, all PCB arrays forming a PCB array set; and S3, comparing the schematic diagram array set with the PCB array set, and outputting differences between the two array sets.

Preferably, the step S2 specifically includes sub-steps: S21, reading the schematic diagram netlist/PCB netlist files and processing the files line by line; S22, determining whether a character is a start character; if yes, the method proceeds to step S23; otherwise, the method goes back to step S21; S23, determining whether all the network data have been read; if yes, then the method will end; otherwise the method proceeds to step S24; S24, forming a netlist connection relationship corresponding to each network into a schematic diagram array/PCB array, and then the method proceeds to step S23.

Figure 1:
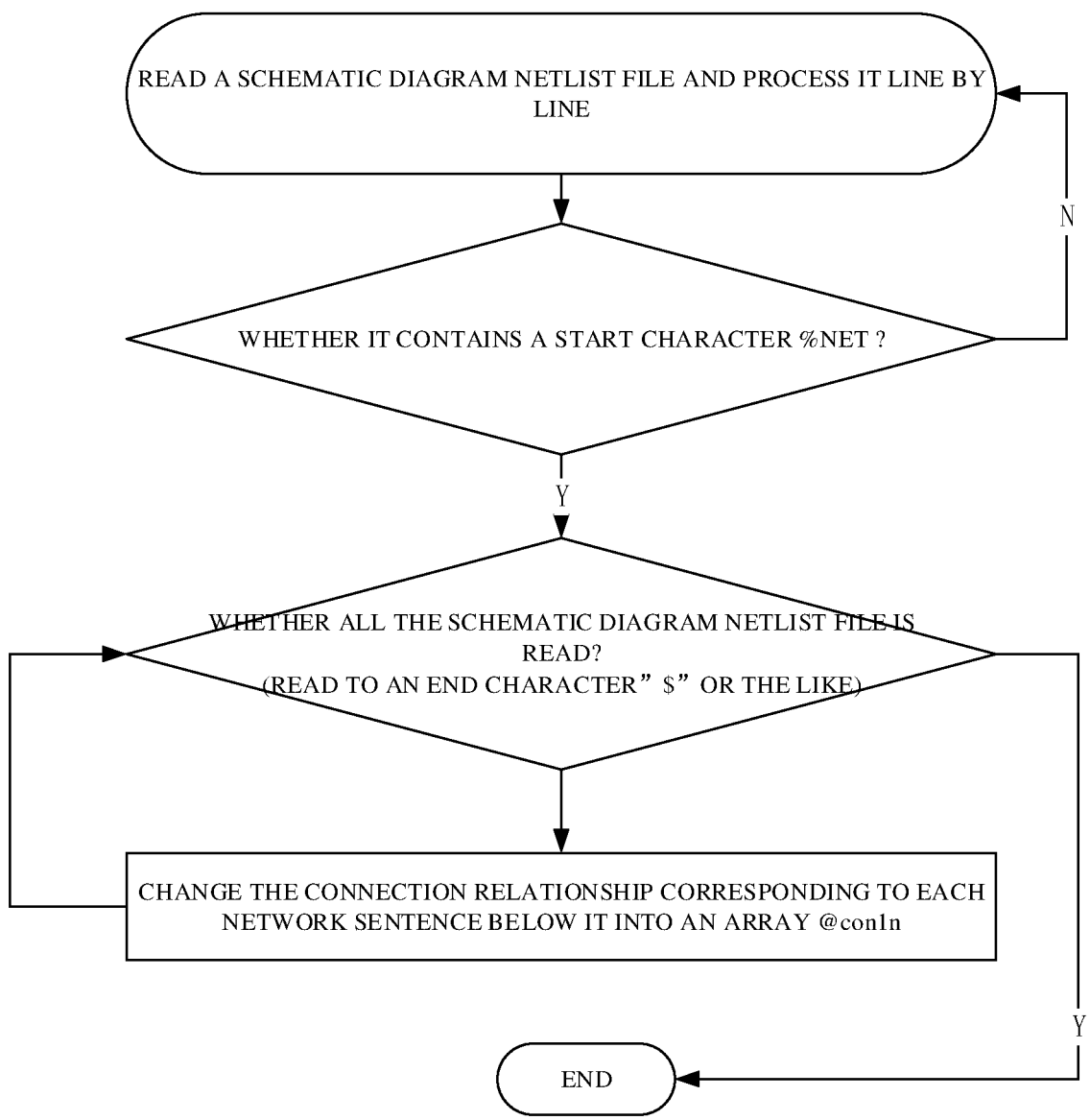
FIG. 1 is a flow diagram of schematic diagram netlist processing in step S2 of an embodiment of the present disclosure.

As shown in FIG. 1, firstly, the schematic diagram netlist file is read and is processed line by line, and whether the schematic diagram netlist file contains a start character % NET is determined. If yes, then the connection relationship corresponding to each network sentence below is changed into an array. Each network corresponds to an array, and the content of the array is the connection relationship of the pins of the components (without a network name in the front of it). For convenience of description, the names of the schematic arrays are recorded as @con11,@con12, . . . ,@con1n, wherein n represents the number of networks in the netlist.

For example, an array set formed in a schematic diagram netlist is as follow:
  @con11=(L45-1,X6-3,C753-1)
  @con12=(c1-1,c2-1,c3-2, . . . )
  . . .
until the schematic netlist file has been totally read, for example an end character "$" or the like has been read.

Figure 2:
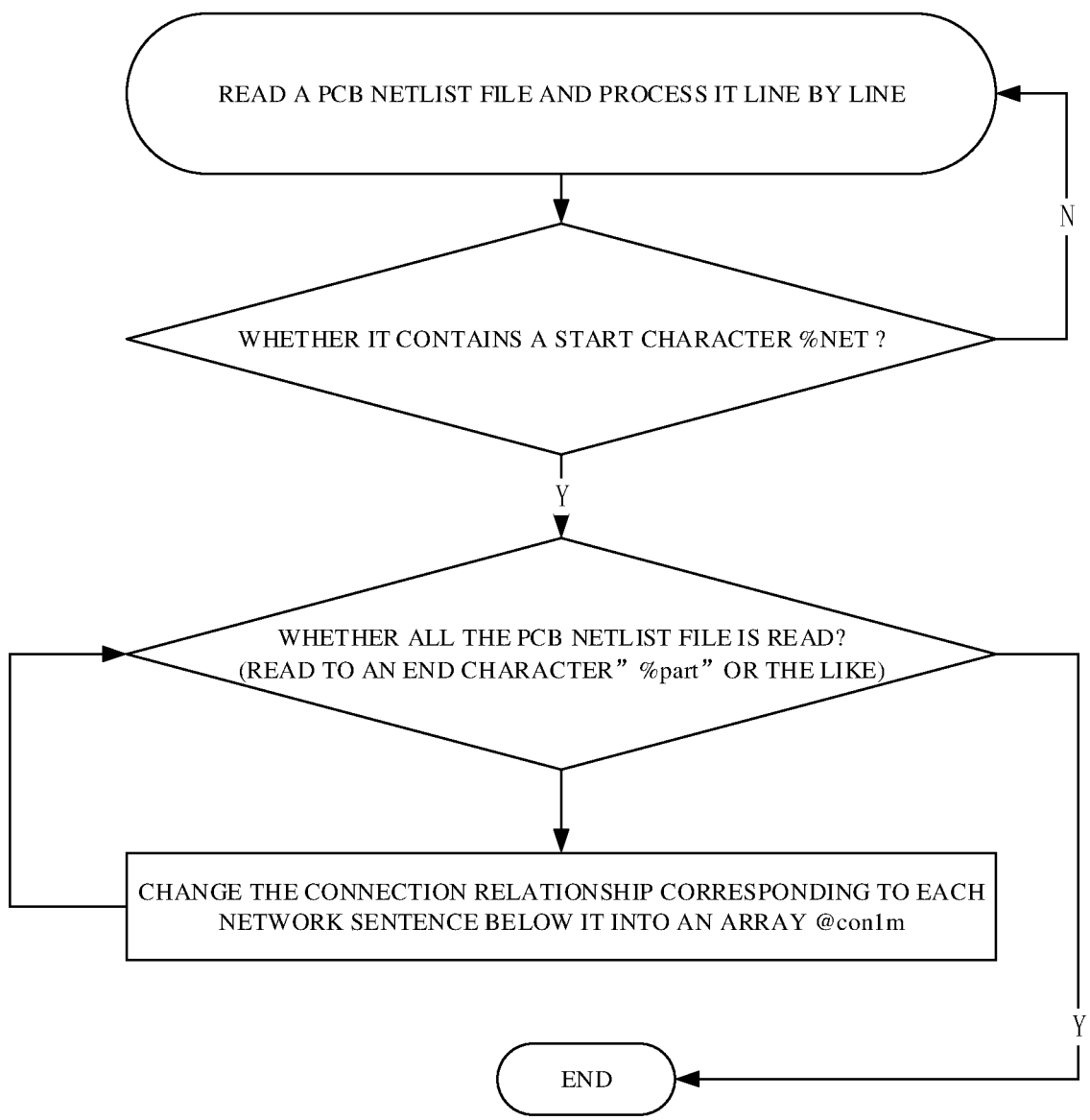
FIG. 2 is a flow diagram of PCB netlist processing in step S2 of an embodiment of the present disclosure.

As shown in FIG. 2, the PCB netlist file is read next and is processed line by line, and whether the PCB netlist file contains a start character % NET is determined. If yes, then the connection relationship corresponding to each network sentence below is change into an array. Each network corresponds to an array, and the content of the array is the connection relationship of the pins of the components (without a network name in the front of it). For convenience of description, the names of the schematic arrays are recorded as @con21, @con22, . . . , @con2m, wherein m represents the number of networks in the netlist.

For example, an array set formed in a schematic diagram netlist is as follow (the program could remove the character "/" from the netlist file):
    @con21=(L45-1,X6-3,C753-1)
    @con22=(c1-1,c2-1,c3-2, . . . )
    . . .
until the schematic netlist file has been totally read, for example an end character "% Part" or the like has been read.

A schematic diagram array set {@con11,@con12 . . . @con1n} and a PCB data array set {@con21, @con22 . . . @con2m} can be respectively obtained after the above two steps have been completed.

Preferably, the step S3 specifically includes sub-steps: S31, comparing the schematic diagram arrays with the PCB arrays one by one individually, clearing the exactly same arrays in the schematic diagram arrays and the PCB arrays, forming a schematic diagram array subset and a PCB array subset respectively from remaining arrays that are not exactly the same in the schematic diagram arrays and the PCB arrays; S32, comparing arrays in the schematic diagram array subset and the PCB array subset one by one; and S33, finding out the exactly same arrays, partially same arrays, and completely different arrays in the schematic diagram array subset and the PCB array subset.

Preferably, the step S31 specifically includes sub-steps: S311, reading the schematic diagram arrays one by one; S312, determining whether all the schematic diagram arrays have been read; if yes, then the method will end; otherwise the method proceeds to S313; S313, comparing an i-th schematic diagram array with a k-th PCB array and determine whether they are the same; if yes, then clearing the i-th schematic diagram array and the k-th PCB array; otherwise the method proceeds to S314; S314, determining whether all the PCB arrays have been t read; if yes, then letting i=i+1 and returning to execute step S312; otherwise returning to execute step S313.

Figure 3:
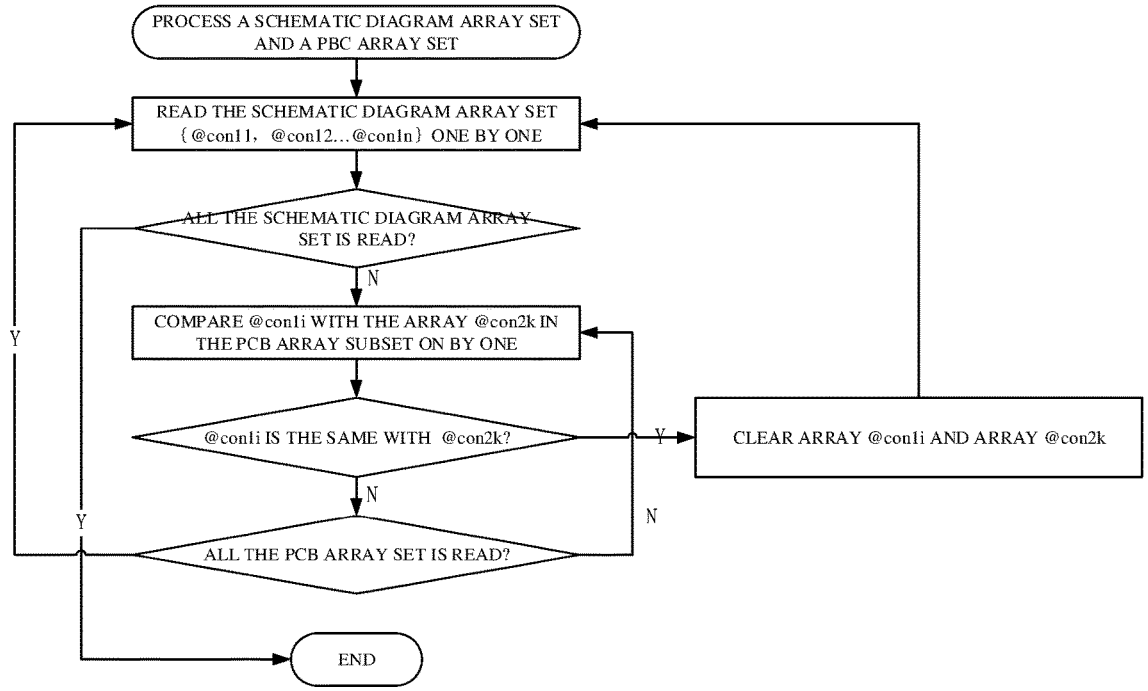
FIG. 3 is a flow diagram of processing a schematic diagram array set and a PCB array set in step S31 of an embodiment of the present disclosure.

As shown in FIG. 3, the schematic diagram array set {@con11, @con12 . . . @con1n} is compared with the PCB data array set {@con21, @con22 . . . @con2m}, and the exactly same arrays are founded out and cleared. Details are as follows:

The schematic array set {@con11, @con12 . . . @con1n} is read one by one, and the PCB array set {@con21, @con22 . . . @con2m} is read one by one, and then whether @con1i is the same as @con2k is determined; if yes, then the array @con1i and the array @con2k are cleared.

After the above steps are completed, the arrays that are not exactly the same in the schematic diagram array set and the PCB data array set, that is, the schematic array subset and PCB data array subset, are left.

Preferably, the step S33 specifically includes sub-steps: S331, comparing the schematic diagram arrays in the schematic diagram array subset with the PCB arrays in the PCB array subset and determining whether there is an intersection of the pins of the components; if there is an intersection, writing the non-intersecting component pins into a result file and clearing two arrays with intersections; otherwise the method proceeds to step S332; S332, writing the arrays with no intersection therebetween in the schematic diagram array subset and the PCB array subset into the result file.

Preferably, the step S331 specifically includes sub-steps: S3311, reading the schematic diagram arrays in the schematic diagram array subset one by one; S3312, determining whether all the schematic diagram arrays in the schematic array subset have been=read; if yes, then the method will end; otherwise, the method proceeds to S3313; S3313, comparing an i-th schematic diagram array in the schematic diagram array subset with a k-th PCB array in the PCB array subset, and determining whether there is an intersection of the pins of the components; if there is an intersection, writing the non-intersecting component pins into the result file and clearing two arrays with intersections, and then the method proceeds to step S3314; otherwise the method proceeds to S3315; S3314, letting i=i+1, and returning to step S3312; S3315, determining whether all the PCB arrays have been read; if yes, then writing the component pins with no intersection into the result file, letting i=i+1, and returning to step S3312.

Figure 4:
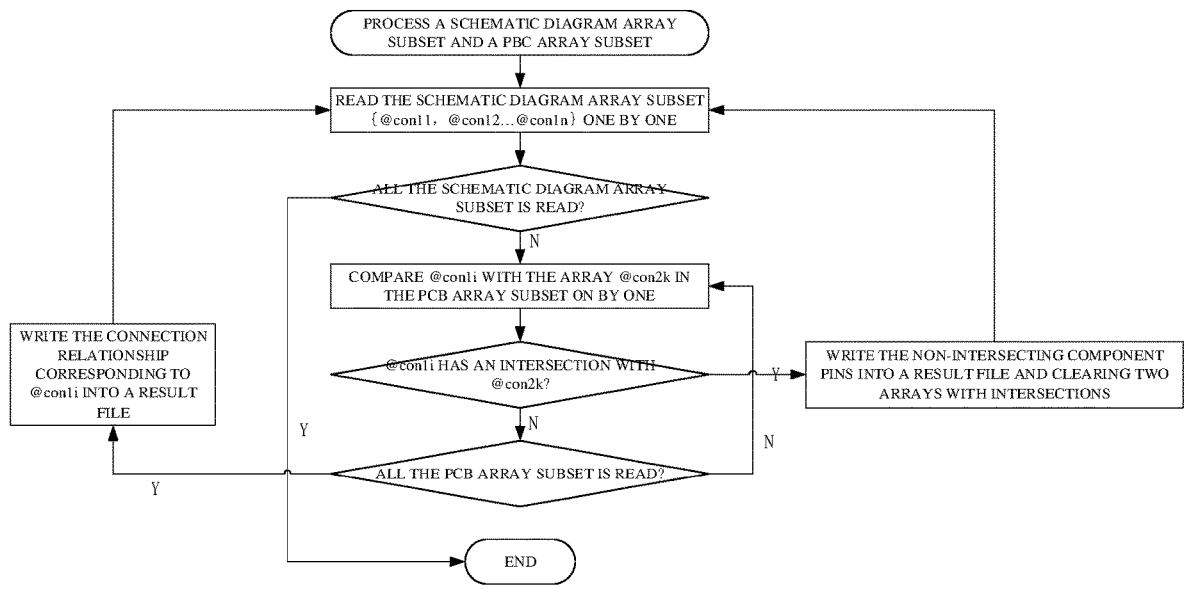
FIG. 4 is a flow diagram of processing a schematic diagram array subset and a PCB array subset in step S331 of an embodiment of the present disclosure.

As shown in FIG. 4, the nonempty (i.e. not exactly the same) arrays in the remaining schematic array set {@con11, @con12 . . . @con1n} and the PCB array set {@con21, @con22 . . . @con2m} are processed. The schematic array subset is read one by one and the PCB array subset is read one by one, and whether there is an intersection between @con1i and @con2k is determined; if there is an intersection between @con1i and @con2k, the non-intersecting component pins are written to the result file, and both the arrays that have an intersection are cleared. Otherwise, whether the subset of the PCB data set has been totally read is determined, if yes, then @con1i is written into the result file (represents that this network connection @con1i is an additional component pin), and @con1i is cleared; otherwise the PCB array subset is read one by one continually until the schematic diagram subset has been totally read. Lastly, the non-empty arrays in the PCB array subset are written into the result file (representing this network connection of the array is an additional component pin).

In summary, the output result file of the present disclosure includes the following contents: Additional (different) pin connection points in the schematic diagram, the additional (different) pin connection points in the PCB, the connection relationship only in the schematic diagram and the connection relationship only in the PCB.

For example, the output result of a certain EDA software using the netlist comparison of the present disclosure is as follows:
    the additional (different) pin connection point in the schematic diagram: P22-1;
    the additional (different) pin connection point in the schematic diagram: U1-33;
    the additional (different) pin connection point in the PCB: U1-33A;
    the additional (different) pin connection point in the schematic diagram: Y1-2;
    the connection relationships only in the schematic diagram: U11-41, Y11-2;
    the connection relationships only in the schematic diagram: U111-41, Y111-2;
    the connection relationships only in the PCB: C35M-1, U1M-42, Y1M-1;
    the connection relationships only in the PCB: C36M-1, U1M-41.

The present disclosure compares only the connection relationship of the components, and overcomes the problem of the existing EDA software. That is, when the existing EDA software compares the netlists, the same network names are found first, and then the device connection relationships in the same network are compared, in which way it fails to deal with a condition where a pin connection relationship of components does not change while a network name changes caused by the conversion of EDA software products. The present disclosure can effectively ensure the accuracy of connection after a schematic diagram and a PCB network are converted.

The present disclosure can be widely applied to netlist comparison systems of pin connection relationships of various EDA software components.

The detailed embodiments described herein are only for the purpose of illustrating the present disclosure, and are not intended to limit the scope of the present disclosure in any way. It would be understand by a person skilled in the art that various changes and modifications can be made to the embodiments described herein without departing from the scope and spirit of the present disclosure. Such changes and modifications are contemplated by the present disclosure, the scope of which should only be defined by the following claims.

The invention claimed is:

1. A method for performing netlist comparison based on a pin connection relationship of components, comprising:
    S1, acquiring a schematic diagram netlist file based on a schematic diagram, and acquiring a printed circuit board (PCB) netlist file based on a PCB;
    S2, reading networks in the schematic diagram netlist file, forming a netlist connection relationship corresponding to each network into a schematic diagram array, wherein all schematic diagram arrays form a schematic diagram array set; reading networks in the PCB netlist file, forming a netlist connection relationship corresponding to each network into a PCB array, wherein all PCB arrays form a PCB array set; and
    S3, comparing the schematic diagram array set with the PCB array set, and outputting any differences therebetween, further including:
    S31, comparing the schematic diagram arrays with the PCB arrays individually, clearing same arrays in the schematic diagram arrays and the PCB arrays, and respectively forming a schematic diagram array subset and a PCB array subset from the remaining arrays that are not the same in the schematic diagram arrays and the PCB arrays,
    S32, comparing arrays in the schematic diagram array subset and arrays in the PCB array subset individually; and
    S33, finding same arrays, partially same arrays, and different arrays in the schematic diagram array subset and the PCB array subset.

2. The method of claim 1, wherein step S33 further includes:
    S331, comparing the schematic diagram arrays in the schematic diagram array subset with the PCB arrays in the PCB array subset and determining whether there is intersection of pins of the components; wherein if there is intersection, writing non-intersecting pins into a result file, and clearing the schematic diagram arrays and the PCB arrays with intersections; wherein if there is no intersection, proceeding to step S332;
    S332, writing the schematic diagram arrays and the PCB arrays with no intersection between the schematic diagram array subset and the PCB array subset into the result file.

3. The method of claim 2, wherein step S331 further includes:
    S3311, reading the schematic diagram arrays in the schematic diagram array subset individually;
    S3312, determining whether all the schematic diagram arrays in the schematic array subset have been read; wherein if all the schematic diagram arrays have been read, then the method will end; wherein if all the schematic diagram arrays have not been read, then proceeding to step S3313;
    S3313, comparing an i-th schematic diagram array in the schematic diagram array subset with a k-th PCB array in the PCB array subset, and determining whether there is intersection of pins; wherein if there is intersection, writing the non-intersecting pins into the result file and clearing the i-th schematic diagram arrays and the k-th PCB arrays with intersections, and then proceeding to step S3314; wherein if there is no intersection, the method proceeds to step S3315;
    S3314, letting i=i+1, and returning to step S3312; and
    S3315, determining whether all the PCB arrays have been read; wherein if all the PCB arrays have been read, writing the pins with no intersection into the result file, letting i=i+1, and returning to step S3312.

4. The method of claim 1, wherein step S31 further includes:
    S311, reading the schematic diagram arrays individually;
    S312, determining whether all the schematic diagram arrays have been read; wherein if all the schematic diagram arrays have been read the method will end; wherein if all the schematic diagram arrays have not been read the method proceeds to step S313;
    S313, comparing an i-th schematic diagram array with a k-th PCB array and determining whether the i-th schematic diagram array and the k-th PCB array are the same; wherein if the i-th schematic diagram array and the k-th PCB array are the same, clearing the i-th schematic diagram array and the k-th PCB array; wherein if the i-th schematic diagram array and the k-th PCB array are not the same, proceeding to step S314; and
    S314, determining whether all the PCB arrays have been read; wherein if all the PCB arrays have been read, letting i=i+1 and returning to step S312; wherein if all the PCB arrays have not been read, returning to step S313.

5. The method of claim 1, wherein step S2 further includes:
    S21, reading the schematic diagram netlist file and the PCB netlist file and processing the schematic diagram netlist file and the PCB netlist file line by line;
    S22, determining whether a character is a start character; wherein if the character is the start character, then proceeding to step S23; wherein if the character is not the start character, then returning to step S21;
    S23, determining whether all network data has been read; wherein if all the network data has been read, then the method will end; wherein if all the network data has not been read, then proceeding to step S24; and
    S24, forming a netlist connection relationship corresponding to each network into a schematic diagram array and a PCB array, and then proceeding to step S23.

* * * * *